(12) United States Patent
Xiao

(10) Patent No.: US 9,444,450 B2
(45) Date of Patent: Sep. 13, 2016

(54) SCAN DRIVING CIRCUIT

(71) Applicant: SHENZHEN CHINA STAR OPTOELECTRONICS TECHNOLOGY CO., LTD., Shenzhen, Guangdong (CN)

(72) Inventor: Juncheng Xiao, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/417,131

(22) PCT Filed: Dec. 19, 2014

(86) PCT No.: PCT/CN2014/094304
§ 371 (c)(1),
(2) Date: Jan. 23, 2015

(65) Prior Publication Data
US 2016/0164514 A1    Jun. 9, 2016

(30) Foreign Application Priority Data

Dec. 8, 2014    (CN) .......................... 201410742157

(51) Int. Cl.
*H03K 17/687*    (2006.01)
*G09G 3/20*    (2006.01)

(52) U.S. Cl.
CPC .............. *H03K 17/687* (2013.01); *G09G 3/20* (2013.01); *G09G 2310/0267* (2013.01); *G09G 2310/062* (2013.01)

(58) Field of Classification Search
CPC .... H03K 17/687; H03K 19/20; H03K 17/28; H03K 5/00; G09G 3/20; G09G 3/36; G09G 3/3688; G09G 2310/0267; G09G 2310/062
USPC .......................... 327/108, 109, 110, 111, 112
See application file for complete search history.

(56) References Cited

U.S. PATENT DOCUMENTS

| 2010/0134399 A1* | 6/2010 | Ki ........................ G09G 3/3677 345/94 |
| 2014/0192039 A1* | 7/2014 | Wang ..................... G11C 19/28 345/213 |

* cited by examiner

*Primary Examiner* — John Poos

(57) ABSTRACT

A scan driving circuit is disclosed, and the scan driving circuit has a pull-up control module, a pull-up module, a pull-down module, a pull-down maintaining module, a bootstrap capacitor and a constant low-level voltage source; the pull-up control module is connected to the pull-up module, the pull-down module, the pull-down maintaining module and the bootstrap capacitor respectively, and the constant low-level voltage source is connected to the pull-down maintaining module and the pull-down module respectively. The electrical leakage phenomenon can be efficiently avoided, and the reliability of the scan driving circuit is thus improved.

17 Claims, 8 Drawing Sheets

SCAN DRIVING CIRCUIT

FIELD OF THE INVENTION

The present invention relates to a field of display driving, and more particularly to a scan driving circuit.

BACKGROUND OF THE INVENTION

A gate driver on array (GOA) generates a scan driver circuit on an existing array substrate of a thin film transistor liquid crystal display (TFT-LCD), in order to implement a driving method which progressively scans for scan lines. A structural diagram of an existing scan driving circuit is illustrated in FIG. 1, and the scan driving circuit 10 includes a pull-up control module 101, a pull-up module 102, a down-stream module 103, a pull-down module 104, a bootstrap capacitor 105, and a pull-down maintaining module 106.

When the scan driving circuit 10 works in a high-temperature state, a threshold voltage of a switch transistor moves to a negative value, so as to lead the switch transistor of each module of the scan driving circuit 10 to easily have an electrical leakage phenomenon, which affects the reliability of the scan driving circuit.

As a result, it is necessary to provide a scan driving circuit to solve the phenomenon existing in the conventional technologies.

SUMMARY OF THE INVENTION

A primary object of the present invention is to provide a scan driving circuit that has a smaller electrical leakage phenomenon and a higher reliability, so as to solve the phenomenon of easily occurring electrical leakage in the existing scan driving circuit, which affects the reliability of the scan driving circuit.

To solve the above problem, the technical solution of the present invention is as follows:

A scan driving circuit is provided in an embodiment of the present invention, the scan driving circuit is used to execute a driving operation for cascaded scan lines, and comprises:

a pull-up control module receiving a previous-level scan signal and a previous-level down-stream signal, and generating a scan level signal corresponding to one of the scan lines according to the previous-level scan signal and the previous-level down-stream signal;

a pull-up module pulling up a present-level scan signal of the corresponding scan line according to the scan level signal and a present-level clock signal;

a pull-down module pulling down the scan level signal of the corresponding scan line according to a clock driving signal;

a down-stream module generating a present-level down-stream signal according to the scan level signal and a present-level clock signal;

a pull-down maintaining module keeping the scan level signal of the corresponding scan line in a low-level;

a bootstrap capacitor generating a high-level of the present-level scan signal of the scan line;

a constant low-level voltage source providing a pull-down low-level; and a reset module executing a reset operation for the scan level signal of the present-level scan line;

wherein the pull-up control module is connected to the pull-up module, the pull-down module, the down-stream module, the pull-down maintaining module and the bootstrap capacitor respectively, and the constant low-level voltage source is connected to the pull-down maintaining module and the pull-down module respectively;

wherein the pull-up control module comprises a first switch transistor, a control end of the first switch transistor inputs the previous-level down-stream signal, an input end of the first switch transistor inputs the previous-level scan signal, and an output end of the first switch transistor is connected to the pull-up module, the pull-down module, the down-stream module, the pull-down maintaining module and the bootstrap capacitor respectively.

In the scan driving circuit of the present invention, the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs a present-level scan signal.

In the scan driving circuit of the present invention, the pull-down module comprises a third switch transistor, a control end of the third switch transistor inputs the clock driving signal, an input end of the third switch transistor is connected to the output end of the first switch transistor of the pull-up control module, and an output end of the third switch transistor is connected to the constant low-level voltage source.

In the scan driving circuit of the present invention, the pull-down maintaining module comprises a fifth switch transistor, a sixth switch transistor, a seventh switch transistor, an eighth switch transistor, a ninth switch transistor and a tenth switch transistor;

wherein a control end of the fifth switch transistor is connected to a high electrical potential signal, an input end of the fifth switch transistor is connected to the high electrical potential signal, and an output end of the fifth switch transistor is connected to a control end of the sixth switch transistor;

wherein an input end of the sixth switch transistor is connected to the high electrical potential signal, and an output end of the sixth switch transistor is connected to a reference point P(N);

wherein a control end of the seventh switch transistor is connected to the output end of the first switch transistor, an input end of the seventh switch transistor is connected to the reference point P(N), and an output end of the seventh switch transistor is connected to an input end of the eighth switch transistor;

wherein a control end of the eighth switch transistor is connected to the output end of the fifth switch transistor, and an output end of the eighth switch transistor is connected to the constant low-level voltage source;

wherein a control end of the ninth switch transistor is connected to the reference point P(N), an input end of the ninth switch transistor is connected to the output end of the first switch transistor, and an output end of the ninth switch transistor is connected to the constant low-level voltage source;

wherein a control end of the tenth switch transistor is connected to the reference point P(N), an input end of the tenth switch transistor is connected to the output end of the second switch transistor, and an output end of the tenth switch transistor is connected to the constant low-level voltage source.

In the scan driving circuit of the present invention, the pull-down maintaining module further comprises an eleventh switch transistor;

wherein a control end of the eleventh switch transistor is connected to the output end of the first switch transistor, an input end of the eleventh switch transistor is connected to the output end of the fifth switch transistor, and an output end of the eleventh switch transistor is connected to the control end of the eighth switch transistor.

In the scan driving circuit of the present invention, the constant low-level voltage source provides a first pull-down low-level, a second pull-down low-level and a third pull-down low-level, the output end of the eighth switch transistor is connected to the second pull-down low-level of the constant low-level voltage source, the output end of the ninth switch transistor and the output end of the third switch transistor of the pull-down module are connected to the third pull-down low-level of the constant low-level voltage source respectively, and the output end of the tenth switch transistor is connected to the first pull-down low-level of the constant low-level voltage source.

In the scan driving circuit of the present invention, an absolute value the third pull-down low-level is greater than an absolute value the second pull-down low-level, and the absolute value the second pull-down low-level is greater than an absolute value the first pull-down low-level.

In the scan driving circuit of the present invention, the pull-down maintaining module further comprises a twelfth switch transistor and a thirteenth switch transistor;

wherein a control end of the twelfth switch transistor is connected to the reference point P(N), an input end of the twelfth switch transistor is connected to the output end of the seventh switch transistor, and an output end of the twelfth switch transistor is connected to the high electrical potential signal;

wherein a control end of the thirteenth switch transistor is connected to the high electrical potential signal, an input end of the thirteenth switch transistor is connected to the reference point P(N), and an output end of the thirteenth switch transistor is connected to the high electrical potential signal.

In the scan driving circuit of the present invention, the pull-down maintaining module further comprises a twelfth switch transistor;

wherein a control end of the twelfth switch transistor is connected to the reference point P(N), an input end of the twelfth switch transistor is connected to the output end of the seventh switch transistor, and an output end of the twelfth switch transistor is connected to the reference point P(N).

A scan driving circuit is provided in an embodiment of the present invention, the scan driving circuit is used to execute a driving operation for cascaded scan lines, and comprises:

a pull-up control module receiving a previous-level scan signal and a previous-level down-stream signal, and generating a scan level signal corresponding to one of the scan lines according to the previous-level scan signal and the previous-level down-stream signal;

a pull-up module pulling up a present-level scan signal of the corresponding scan line according to the scan level signal and a present-level clock signal;

a pull-down module pulling down the scan level signal of the corresponding scan line according to a clock driving signal;

a down-stream module generating a present-level down-stream signal according to the scan level signal and a present-level clock signal;

a pull-down maintaining module keeping the scan level signal of the corresponding scan line in a low-level;

a bootstrap capacitor generating a high-level of the present-level scan signal of the scan line; and a constant low-level voltage source providing a pull-down low-level;

wherein the pull-up control module is connected to the pull-up module, the pull-down module, the down-stream module, the pull-down maintaining module and the bootstrap capacitor respectively, and the constant low-level voltage source is connected to the pull-down maintaining module and the pull-down module respectively.

In the scan driving circuit of the present invention, the pull-up control module comprises a first switch transistor, a control end of the first switch transistor inputs the previous-level down-stream signal, an input end of the first switch transistor inputs the previous-level scan signal, and an output end of the first switch transistor is connected to the pull-up module, the pull-down module, the down-stream module, the pull-down maintaining module and the bootstrap capacitor respectively.

In the scan driving circuit of the present invention, the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs a present-level scan signal.

In the scan driving circuit of the present invention, the pull-down module comprises a third switch transistor, a control end of the third switch transistor inputs the clock driving signal, an input end of the third switch transistor is connected to the output end of the first switch transistor of the pull-up control module, and an output end of the third switch transistor is connected to the constant low-level voltage source.

In the scan driving circuit of the present invention, the pull-down maintaining module comprises a fifth switch transistor, a sixth switch transistor, a seventh switch transistor, an eighth switch transistor, a ninth switch transistor and a tenth switch transistor;

wherein a control end of the fifth switch transistor is connected to a high electrical potential signal, an input end of the fifth switch transistor is connected to the high electrical potential signal, and an output end of the fifth switch transistor is connected to a control end of the sixth switch transistor;

wherein an input end of the sixth switch transistor is connected to the high electrical potential signal, and an output end of the sixth switch transistor is connected to a reference point P(N);

wherein a control end of the seventh switch transistor is connected to the output end of the first switch transistor, an input end of the seventh switch transistor is connected to the reference point P(N), and an output end of the seventh switch transistor is connected to an input end of the eighth switch transistor;

wherein a control end of the eighth switch transistor is connected to the output end of the fifth switch transistor, and an output end of the eighth switch transistor is connected to the constant low-level voltage source;

wherein a control end of the ninth switch transistor is connected to the reference point P(N), an input end of the ninth switch transistor is connected to the output end of the first switch transistor, and an output end of the ninth switch transistor is connected to the constant low-level voltage source;

wherein a control end of the tenth switch transistor is connected to the reference point P(N), an input end of the tenth switch transistor is connected to the output end of the second switch transistor, and an output end of the tenth switch transistor is connected to the constant low-level voltage source.

In the scan driving circuit of the present invention, the pull-down maintaining module further comprises an eleventh switch transistor;

wherein a control end of the eleventh switch transistor is connected to the output end of the first switch transistor, an input end of the eleventh switch transistor is connected to the output end of the fifth switch transistor, and an output end of the eleventh switch transistor is connected to the control end of the eighth switch transistor.

In the scan driving circuit of the present invention, the constant low-level voltage source provides a first pull-down low-level, a second pull-down low-level and a third pull-down low-level, the output end of the eighth switch transistor is connected to the second pull-down low-level of the constant low-level voltage source, the output end of the ninth switch transistor and the output end of the third switch transistor of the pull-down module are connected to the third pull-down low-level of the constant low-level voltage source respectively, and the output end of the tenth switch transistor is connected to the first pull-down low-level of the constant low-level voltage source.

In the scan driving circuit of the present invention, an absolute value the third pull-down low-level is greater than an absolute value the second pull-down low-level, and the absolute value the second pull-down low-level is greater than an absolute value the first pull-down low-level.

In the scan driving circuit of the present invention, the pull-down maintaining module further comprises a twelfth switch transistor and a thirteenth switch transistor;

wherein a control end of the twelfth switch transistor is connected to the reference point P(N), an input end of the twelfth switch transistor is connected to the output end of the seventh switch transistor, and an output end of the twelfth switch transistor is connected to the high electrical potential signal;

wherein a control end of the thirteenth switch transistor is connected to the high electrical potential signal, an input end of the thirteenth switch transistor is connected to the reference point P(N), and an output end of the thirteenth switch transistor is connected to the high electrical potential signal.

In the scan driving circuit of the present invention, the pull-down maintaining module further comprises a twelfth switch transistor;

wherein a control end of the twelfth switch transistor is connected to the reference point P(N), an input end of the twelfth switch transistor is connected to the output end of the seventh switch transistor, and an output end of the twelfth switch transistor is connected to the reference point P(N).

In the scan driving circuit of the present invention, the scan driving circuit further comprises:

a reset module executing a reset operation for the scan level signal of the present-level scan line.

In contrast to an existing scan driving circuit, the scan driving circuit of the present invention can successfully avoid an electrical leakage phenomenon through setting a pull-up control module, so as to improve the reliability of a scan driving circuit; the present invention solves the phenomenon of easily occurring electrical leakage in the existing scan driving circuit, which affects the reliability of the scan driving circuit.

To allow the above description of the present invention to be more clear and comprehensive, there are preferred embodiments with the accompanying figures described in detail below.

DETAILED DESCRIPTION OF THE PREFERRED EMBODIMENTS

Figure 1:
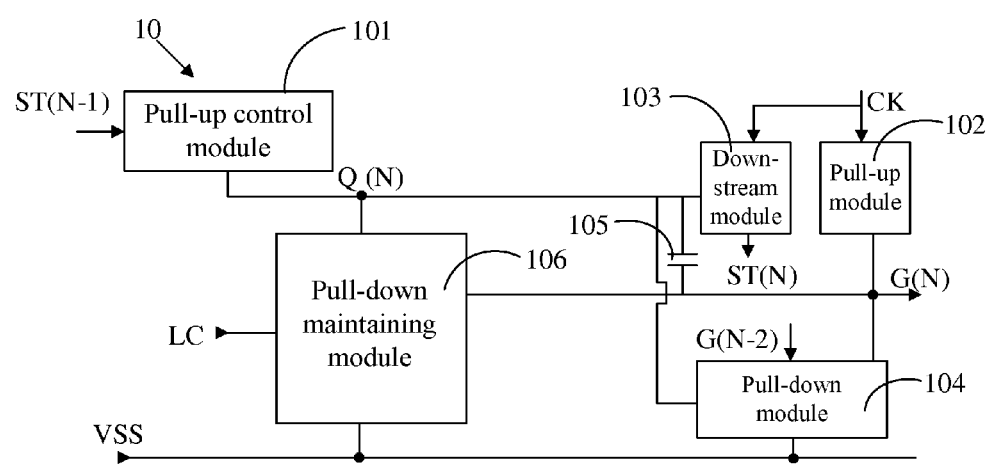
FIG. 1 is a structural diagram of an existing scan driving circuit.

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

In the drawings, units with similar structures are represented with the same label.

Figure 2:
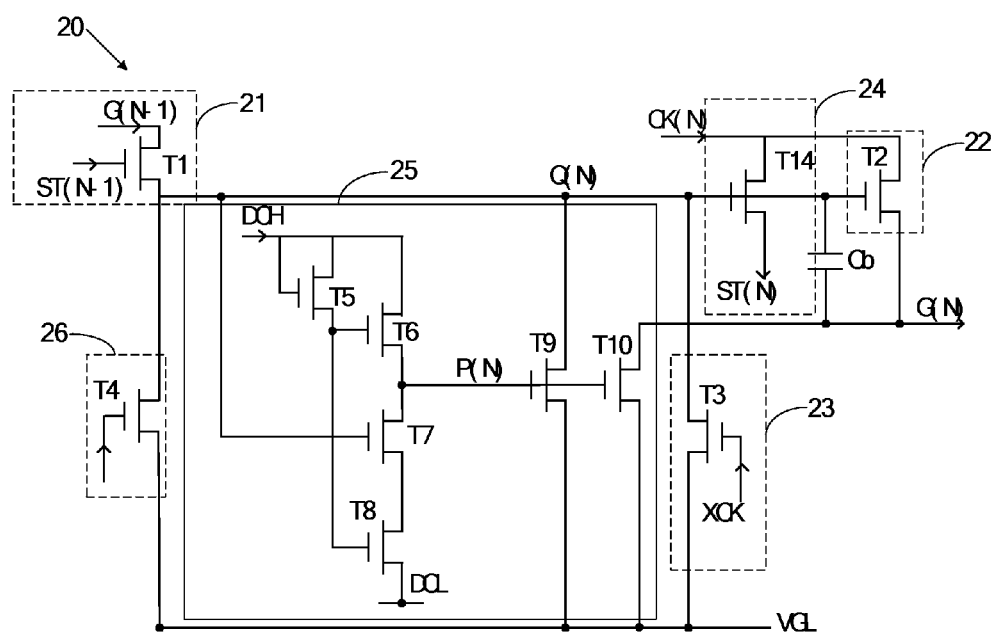
FIG. 2 is a structural diagram of a scan driving circuit according to the first preferred embodiment of the present invention.
Figure 3:
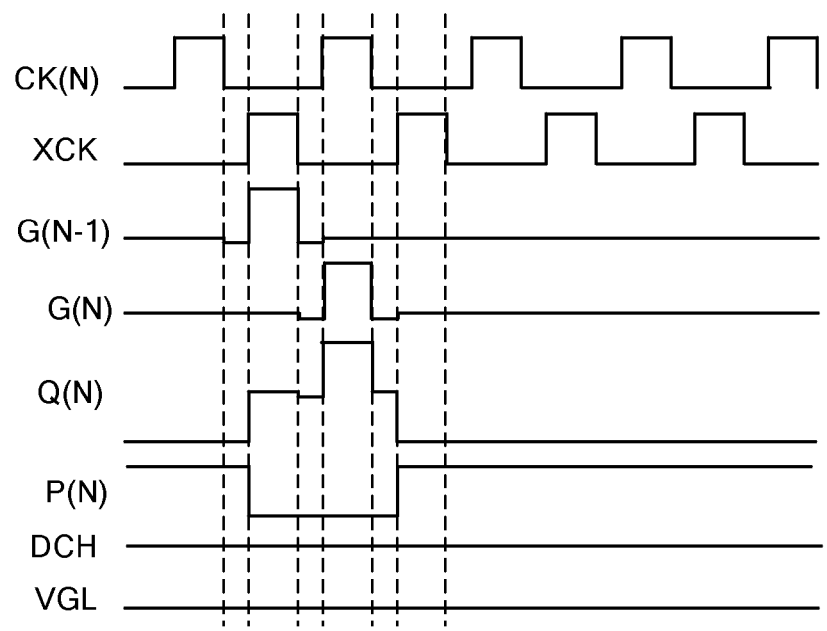
FIG. 3 is a signal waveform diagram of a scan driving circuit according to the first preferred embodiment of the present invention.

Refer to FIG. 2, which is a structural diagram of a scan driving circuit according to the first preferred embodiment of the present invention. FIG. 3 is a signal waveform diagram of a scan driving circuit according to the first preferred embodiment of the present invention. A scan driving circuit 20 of the preferred embodiment comprises a pull-up control module 21, a pull-up module 22, a pull-down module 23, a down-stream module 24, a pull-down maintaining module 25, a bootstrap capacitor Cb, and a constant low-level voltage source VGL. The pull-up control module 21 is used to receive a previous-level scan signal G(N−1) and a previous-level down-stream signal ST(N−1) and generate a scan level signal Q(N) corresponding to one of the scan lines according to the previous-level scan signal G(N−1) and the previous-level down-stream signal ST(N−1); the pull-up module 22 is used to pull up a present-level scan signal G(N) of the corresponding scan line according to the scan level signal Q(N) and a present-level clock signal CK(N); the pull-down module 23 is used to pull down the scan level signal Q(N) of the corresponding scan line according to a clock driving signal XCK; the down-stream module 24 is used to generate a present-level down-stream signal ST(N) according to the scan level signal Q(N) and the present-level clock signal CK(N); the pull-down maintaining module is used to keep the scan level signal Q(N) of the corresponding scan line in a low-level; the bootstrap capacitor Cb is configured between an output end of the first switch transistor T1 and an output end of the pull-up second switch transistor T2, and the bootstrap capacitor Cb is used to generate a high-level of the present-level scan signal G(N) of the scan line; and the constant low-level voltage source is used to provide a pull-down low-level.

The pull-up control module 21 is connected to the pull-up module 22, the pull-down module 23, the down-stream module 24, the pull-down maintaining module 25 and the bootstrap capacitor Cb respectively, and the constant low-level voltage source is connected to the pull-down maintaining module 25 and the pull-down module 23 respectively.

The pull-up control module 21 comprises a first switch transistor T1, a control end of the first switch transistor T1 inputs the previous-level down-stream signal ST(N−1), an input end of the first switch transistor T1 inputs the previous-level scan signal G(N−1), and an output end of the first switch transistor T1 is connected to the pull-up module 22, the pull-down module 23, the down-stream module 24, the pull-down maintaining module 25 and the bootstrap capacitor Cb respectively.

The pull-up module 22 comprises a second switch transistor T2, a control end of the second switch transistor T2 is connected to the output end of the first switch transistor T1 of the pull-up control module 21, an input end of the second switch transistor T2 inputs the present-level clock signal CK(N), and an output end of the second switch transistor T2 outputs a present-level scan signal G(N).

The pull-down module comprises a third switch transistor T3, a control end of the third switch transistor T3 inputs the clock driving signal XCK, an input end of the third switch transistor T3 is connected to the output end of the first switch transistor T1 of the pull-up control module 21, and an output end of the third switch transistor T3 is connected to the constant low-level voltage source VGL.

The down-stream module 24 comprises a fourteenth switch transistor T14, a control end of the fourteenth switch transistor T14 is connected to the input end of the first switch transistor T1 of the pull-up control module 21, an input end of the fourteenth switch transistor T14 inputs the present-level clock signal CK(N), and an output end of the fourteenth switch transistor T14 outputs the present-level down-stream signal ST(N).

The pull-down maintaining module 25 comprises a fifth switch transistor T5, a sixth switch transistor T6, a seventh switch transistor T7, an eighth switch transistor T8, a ninth switch transistor T9 and a tenth switch transistor T10.

A control end of the fifth switch transistor T5 is connected to a high electrical potential signal DCH, an input end of the fifth switch transistor T5 is connected to the high electrical potential signal DCH, and an output end of the fifth switch transistor T5 is connected to a control end of the sixth switch transistor T6.

An input end of the sixth switch transistor T6 is connected to the high electrical potential signal DCH, and an output end of the sixth switch transistor T6 is connected to a reference point P(N).

A control end of the seventh switch transistor T7 is connected to the output end of the first switch transistor T1, an input end of the seventh switch transistor T7 is connected to the reference point P(N), and an output end of the seventh switch transistor T7 is connected to an input end of the eighth switch transistor T8.

A control end of the eighth switch transistor T8 is connected to the output end of the fifth switch transistor T5, and an output end of the eighth switch transistor T8 is connected to the constant low-level voltage source DCL.

A control end of the ninth switch transistor T9 is connected to the reference point P(N), an input end of the ninth switch transistor T9 is connected to the output end of the first switch transistor T1, and an output end of the ninth switch transistor T9 is connected to the constant low-level voltage source VGL.

A control end of the tenth switch transistor T10 is connected to the reference point P(N), an input end of the tenth switch transistor T10 is connected to the output end of the second switch transistor T2, and an output end of the tenth switch transistor T10 is connected to the constant low-level voltage source VGL.

Preferably, the scan driving circuit 20 of the present preferred embodiment further comprises a reset module 26 which is used to execute a reset operation for the scan level signal Q(N) of the present-level scan line. The reset module 26 comprises a fourth switch transistor T4, which implements to execute a reset operation for the scan level signal Q(N) (reference point Q(N)) of the scan line through inputting a high-level signal to the control end of the fourth switch transistor T4.

Referring to FIG. 2 and FIG. 3, the scan driving circuit 20 of the preferred embodiment is in a work state. When the previous-level down-stream signal ST(N−1) is in a high-level, the clock driving signal XCK is in a low-level; the first switch transistor is turned on, and the previous-level scan signal G(N−1) charges for the bootstrap capacitor Cb through the first switch transistor T1 so as to let the reference point Q(N) to upgrade to a higher level. Then, the previous-level down-stream signal ST(N−1) is turned into a low-level, and the first switch transistor is turned off; the reference point Q(N) keeps a higher level through the bootstrap capacitor Cb, and the second switch transistor T2 and the fourth switch transistor T4 are turned on.

Then, the present-level clock signal CK(N) is turned into a high-level, the clock signal CK(N) charges for the bootstrap capacitor Cb continually through the second switch transistor T2 so as to let the reference point Q(N) to achieve to a higher level, and the present-level scan signal G(N) is turned into a high-level.

At the same time, the seventh switch transistor T7 is turned on; the fifth switch transistor T5 is turned on when the high electrical potential signal operates, so that the eighth switch transistor T8 is also turned on and the reference point P(N) keeps in a low-level under the control of the constant low-level voltage source DCL. The ninth switch transistor T9 and the tenth switch transistor keep in turn-off state so as to ensure that the scan control signal Q(N) is in a high-level.

When the clock driving signal XCK is turned into a high-level, the third switch transistor is turned on; the reference point (the scan control signal Q(N) is pulled down to a low-level by the constant low-level voltage source VGL; at this time, the fourteenth switch transistor T13 and the second switch transistor T2 are turned off.

The pull-down maintaining module 25 keeps the reference point Q(N) in a low-level through the ninth switch transistor T9 and the tenth switch transistor T10. Specifically, the scan control signal Q(N) is pulled down to a low-level by the constant low-level voltage source VGL, a control end of the seventh switch transistor T7 inputs the low-level scan control signal Q(N), the seventh switch transistor T7 is turned off, and the fifth switch transistor T5 and the sixth switch transistor T6 are turned on due to the effect of the high electrical potential signal DCH. Therefore, the reference point P(N) is turned into a high-level under the effect of the high electrical potential signal DCH, so as to the ninth switch transistor T9 and the tenth switch transistor T10 are turned into a turn-on state, and the present-level scan signal G(N) and the scan control signal Q(N) keep in a low-level state.

In summary, when the reference point is in a high electrical potential state, the pull-down maintaining unit 25 of the scan driving circuit 20 of the present preferred embodiment turns off the ninth switch transistor T9 and the tenth switch transistor T10 through keeping the reference point P(N) in a low-level state, so as to successfully keep the reference point Q(N) and the present-level scan signal G(N) in a high-level. Furthermore, when the reference point Q(N) is in a low-level state, the reference point P(N) is kept in a high-level state through the effect of the pull-down maintaining module 25, so as to turn on the ninth switch transistor T9 and the tenth switch transistor T10 and successfully keep the reference point Q(N) and the present-level scan signal G(N) in a low-level.

Through setting a pull-up control module, a scan driving circuit of the present invention can successfully avoid an electrical leakage phenomenon, so as to improve the reliability of a scan driving circuit.

Figure 4:
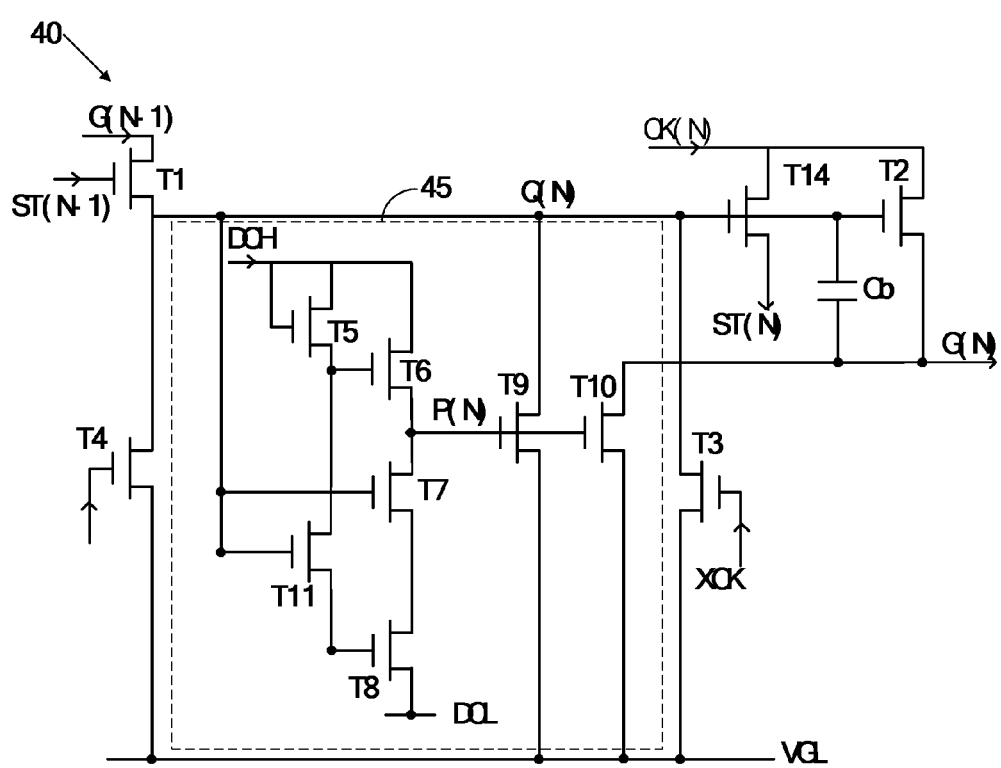
FIG. 4 is a structural diagram of a scan driving circuit according to the second preferred embodiment of the present invention.

Refer to FIG. 4, which is a structural diagram of a scan driving circuit according to the second preferred embodiment of the present invention. On the basis of the first preferred embodiment, the pull-down maintaining module 45 of the scan driving circuit 40 further comprises a eleventh switch transistor T11. A control end of the eleventh switch transistor T11 is connected to the output end of the first switch transistor T1, an input end of the eleventh switch transistor T11 is connected to the output end of the fifth switch transistor T5, and an output end of the eleventh switch transistor T11 is connected to the control end of the eighth switch transistor T8.

When the scan driving circuit 40 of the present preferred embodiment is in a work state and the clock driving signal XCK is turned into a high-level, the third switch transistor T3 is turned on, and the scan control signal Q(N) is pulled down to a low-level by the constant low-level voltage source VGL. At this time, the control end of the eleventh switch transistor T11 is connected to a low-level scan control signal Q(N), and the eleventh switch transistor T11 is turned off. Hence, the eighth switch transistor T8 is also turned off, so as to avoid that the reference point P(N) occurs electrical leakage phenomenon through the eighth switch transistor T8.

Therefore, the scan driving circuit of the present preferred embodiment ensures that the reference point P(N) is in a high electrical potential state efficiently.

Figure 5:
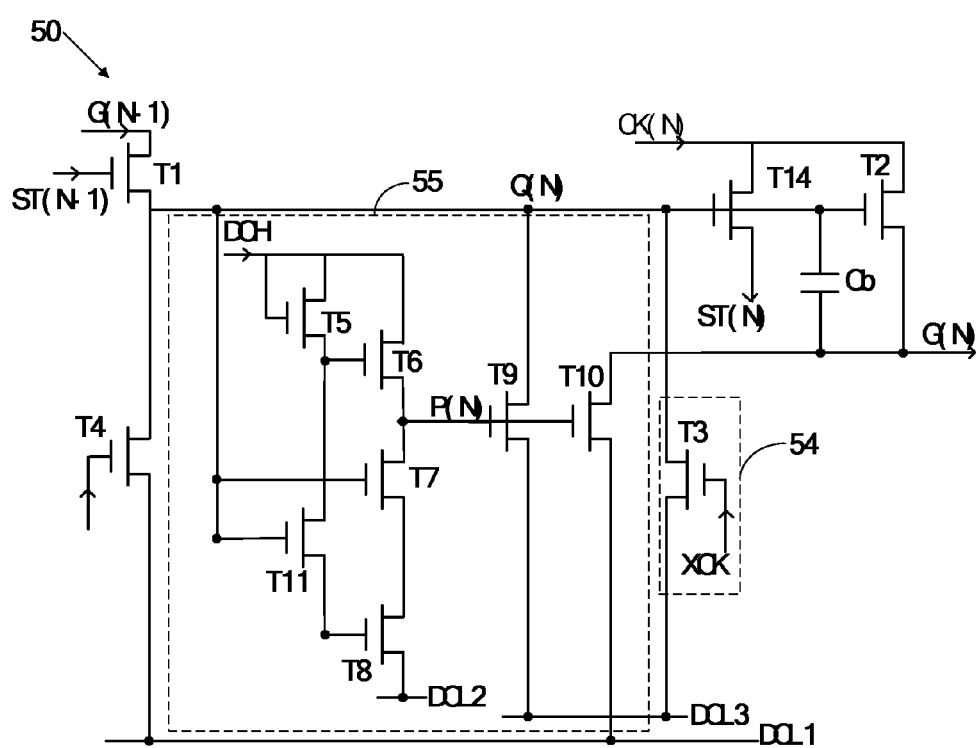
FIG. 5 is a structural diagram of a scan driving circuit according to the third preferred embodiment of the present invention.

Refer to FIG. 5, FIG. 5 is a structural diagram of a scan driving circuit according to the third preferred embodiment of the present invention. On the basis of the second preferred embodiment, the constant low-level voltage source of the scan driving circuit 50 of the present preferred embodiment provides a first pull-down low-level DCL1, a second pull-down low-level DCL2 and a third pull-down low-level DCL3; the output end of the eighth switch transistor T8 is connected to the second pull-down low-level DCL2 of the constant low-level voltage source; the output end of the ninth switch transistor T9 and the output end of the third switch transistor T3 of the pull-down module 54 are connected to the third pull-down low-level DCL3 of the constant low-level voltage source respectively, and the output end of the tenth switch transistor T10 is connected to the first pull-down low-level DCL1 of the constant low-level voltage source.

An absolute value the third pull-down low-level DCL3 is greater than an absolute value the second pull-down low-level DCL2, and the absolute value the second pull-down low-level DCL2 is greater than an absolute value the first pull-down low-level DCL1. The scan driving circuit 50 of the present preferred embodiment pulls down the scan control signal Q(N) to a lower electrical potential through the third switch transistor T3 and the ninth switch transistor T9, so as to turn off the eleventh switch transistor T11 when the scan control signal Q(N) is in a low electrical potential, so as to avoid that the control end of the sixth switch transistor T6 occurs electrical leakage through the eleventh switch transistor T11.

Therefore, the scan driving circuit of the present preferred embodiment ensures that the reference point P(N) is in a high electrical potential state efficiently.

Figure 6:
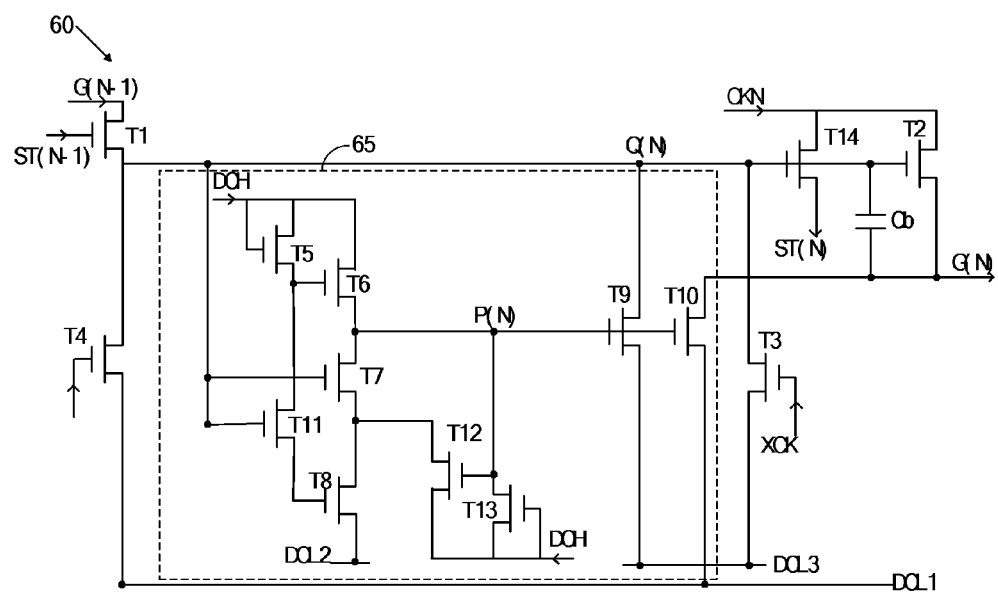
FIG. 6 is a structural diagram of a scan driving circuit according to the fourth preferred embodiment of the present invention.

Refer to FIG. 6, which is a structural diagram of a scan driving circuit according to the fourth preferred embodiment of the present invention. On the basis of the third preferred embodiment, the pull-down maintaining module 65 of the scan driving circuit 60 of the present preferred embodiment further comprises a twelfth switch transistor T12 and a thirteenth switch transistor T13.

A control end of the twelfth switch transistor T12 is connected to the reference point P(N), an input end of the twelfth switch transistor T12 is connected to the output end of the seventh switch transistor T7, and an output end of the twelfth switch transistor T12 is connected to the high electrical potential signal DCH. A control end of the thirteenth switch transistor T13 is connected to the high electrical potential signal DCH, an input end of the thirteenth switch transistor T13 is connected to the reference point P(N), and an output end of the thirteenth switch transistor T13 is connected to the high electrical potential signal DCH.

When the reference point P(N) is in a high electrical potential, the scan driving circuit of the present preferred embodiment efficiently ensures that the reference point P(N) is in a high electrical potential state through the twelfth switch transistor T12 and the thirteenth switch transistor, so as to avoid a variation of the high electrical potential of the reference point P(N), wherein the variation is attributed to an electrical leakage.

Figure 7:
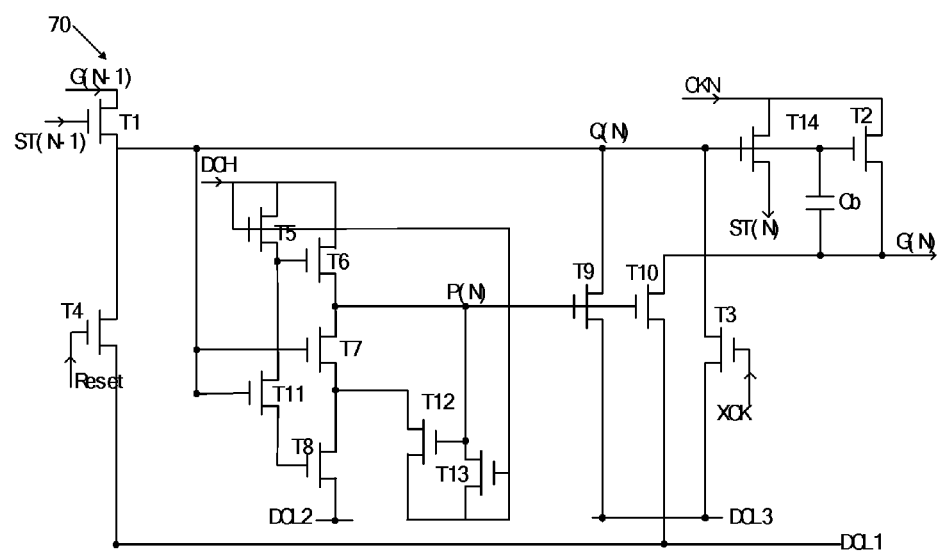
FIG. 7 is a structural diagram of a scan driving circuit according to the fifth preferred embodiment of the present invention.

Refer to FIG. 7, which is a structural diagram of a scan driving circuit according to the fifth preferred embodiment of the present invention. The circuit structure of the scan driving circuit 70 of the present preferred embodiment is essentially the same with the fourth preferred embodiment. In the present preferred embodiment, the twelfth switch transistor T12, the thirteenth switch transistor T13, the fifth switch transistor T5 and the sixth switch transistor T6 share a high electrical potential signal DCH through a node, so as to reduce the production cost of the scan driving circuit 70.

Figure 8:
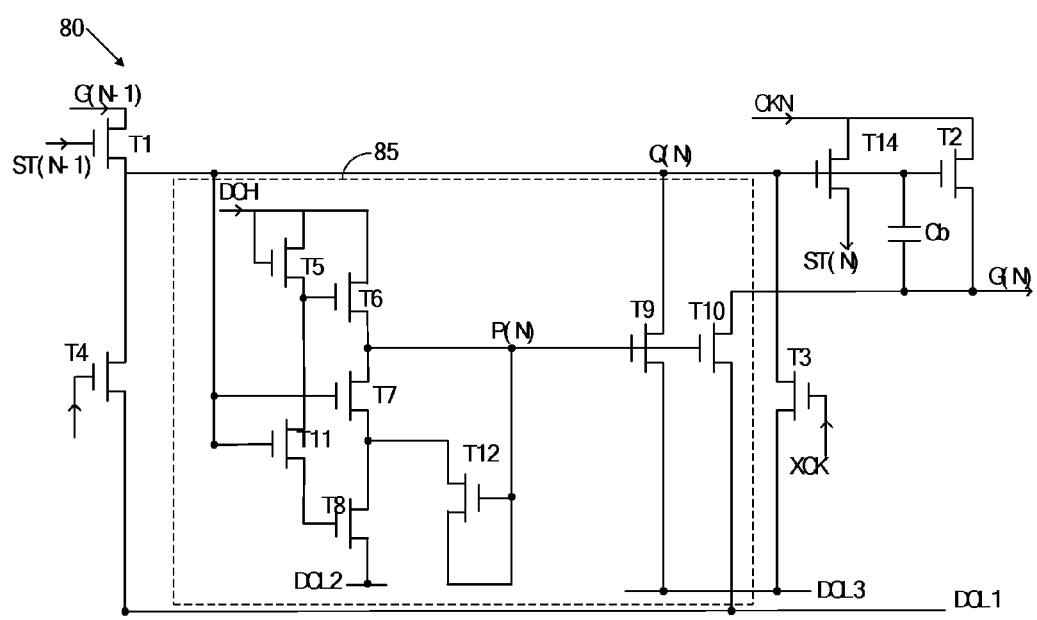
FIG. 8 is a structural diagram of a scan driving circuit according to the sixth preferred embodiment of the present invention.

Refer to FIG. 8, which is a structural diagram of a scan driving circuit according to the sixth preferred embodiment of the present invention. On the basis of the third preferred embodiment, the pull-down maintaining module 85 of the scan driving circuit 80 of the present preferred embodiment further comprises the twelfth switch transistor.

A control end of the twelfth switch transistor T12 is connected to the reference point P(N), an input end of the twelfth switch transistor T12 is connected to the output end of the seventh switch transistor T7, and an output end of the twelfth switch transistor T12 is connected to the reference point P(N).

The scan driving circuit of the present preferred embodiment efficiently ensures that the reference point P(N) keeps in a high electrical potential through the twelfth switch transistor when the reference point P(N) is at a high electrical potential, so as to avoid a variation of the high electrical potential of the reference point P(N), wherein the variation is attributed to an electrical leakage.

Through setting a pull-up control module, a scan driving circuit of the present invention can successfully avoid an electrical leakage phenomenon, so as to improve the reliability of a scan driving circuit; and the present invention solves the phenomenon of easily occurring electrical leakage in the existing scan driving circuit, which affects the reliability of the scan driving circuit.

In summary, the present invention has been disclosed with preferred embodiments thereof, but the above described preferred embodiments are not intended to limit the present invention. Those who are skilled in the art can make many changes and modifications to the described embodiment which can be carried out without departing from the scope and the spirit of the invention that is intended to be limited only by the appended claims.

What is claimed is:

1. A scan driving circuit, executing a driving operation for cascaded scan lines, comprising:
   a pull-up control module receiving a previous-level scan signal and a previous-level down-stream signal, and generating a scan level signal corresponding to one of the scan lines according to the previous-level scan signal and the previous-level down-stream signal;
   a pull-up module pulling up a present-level scan signal of the corresponding scan line according to the scan level signal and a present-level clock signal;
   a pull-down module pulling down the scan level signal of the corresponding scan line according to a clock driving signal;
   a down-stream module generating a present-level down-stream signal according to the scan level signal and a present-level clock signal;
   a pull-down maintaining module keeping the scan level signal of the corresponding scan line in a low-level;
   a bootstrap capacitor generating a high-level of the present-level scan signal of the scan line;
   a constant low-level voltage source providing a pull-down low-level; and
   a reset module executing a reset operation for the scan level signal of the present-level scan line;
   wherein the pull-up control module is connected to the pull-up module, the pull-down module, the down-stream module, the pull-down maintaining module and the bootstrap capacitor respectively, and the constant low-level voltage source is connected to the pull-down maintaining module and the pull-down module respectively;
   wherein the pull-up control module comprises a first switch transistor, a control end of the first switch transistor inputs the previous-level down-stream signal, an input end of the first switch transistor inputs the previous-level scan signal, and an output end of the first switch transistor is connected to the pull-up module, the pull-down module, the down-stream module, the pull-down maintaining module and the bootstrap capacitor respectively;
   wherein the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs the present-level scan signal.

2. The scan driving circuit according to claim 1, wherein the pull-down module comprises a third switch transistor, a control end of the third switch transistor inputs the clock driving signal, an input end of the third switch transistor is connected to the output end of the first switch transistor of the pull-up control module, and an output end of the third switch transistor is connected to the constant low-level voltage source.

3. The scan driving circuit according to claim 1, wherein the pull-down maintaining module comprises a fifth switch transistor, a sixth switch transistor, a seventh switch transistor, an eighth switch transistor, a ninth switch transistor and a tenth switch transistor;
   wherein a control end of the fifth switch transistor is connected to a high electrical potential signal, an input end of the fifth switch transistor is connected to the high electrical potential signal, and an output end of the fifth switch transistor is connected to a control end of the sixth switch transistor;
   wherein an input end of the sixth switch transistor is connected to the high electrical potential signal, and an output end of the sixth switch transistor is connected to a reference point P(N);
   wherein a control end of the seventh switch transistor is connected to the output end of the first switch transistor, an input end of the seventh switch transistor is connected to the reference point P(N), and an output end of the seventh switch transistor is connected to an input end of the eighth switch transistor;
   wherein a control end of the eighth switch transistor is connected to the output end of the fifth switch transistor, and an output end of the eighth switch transistor is connected to the constant low-level voltage source;
   wherein a control end of the ninth switch transistor is connected to the reference point P(N), an input end of the ninth switch transistor is connected to the output end of the first switch transistor, and an output end of the ninth switch transistor is connected to the constant low-level voltage source;
   wherein a control end of the tenth switch transistor is connected to the reference point P(N), an input end of the tenth switch transistor is connected to the output end of the second switch transistor, and an output end of the tenth switch transistor is connected to the constant low-level voltage source.

4. The scan driving circuit according to claim 3, wherein the pull-down maintaining module further comprises an eleventh switch transistor;
   wherein a control end of the eleventh switch transistor is connected to the output end of the first switch transistor, an input end of the eleventh switch transistor is connected to the output end of the fifth switch transistor, and an output end of the eleventh switch transistor is connected to the control end of the eighth switch transistor.

5. The scan driving circuit according to claim 4, wherein the constant low-level voltage source provides a first pull-down low-level, a second pull-down low-level and a third pull-down low-level, the output end of the eighth switch transistor is connected to the second pull-down low-level of the constant low-level voltage source, the output end of the ninth switch transistor and the output end of the third switch transistor of the pull-down module are connected to the third pull-down low-level of the constant low-level voltage source respectively, and the output end of the tenth switch transistor is connected to the first pull-down low-level of the constant low-level voltage source.

6. The scan driving circuit according to claim 5, wherein an absolute value the third pull-down low-level is greater than an absolute value the second pull-down low-level, and the absolute value the second pull-down low-level is greater than an absolute value the first pull-down low-level.

7. The scan driving circuit according to claim 5, wherein the pull-down maintaining module further comprises a twelfth switch transistor and a thirteenth switch transistor; wherein a control end of the twelfth switch transistor is connected to the reference point P(N), an input end of the twelfth switch transistor is connected to the output end of the seventh switch transistor, and an output end of the twelfth switch transistor is connected to the high electrical potential signal;

wherein a control end of the thirteenth switch transistor is connected to the high electrical potential signal, an input end of the thirteenth switch transistor is connected to the reference point P(N), and an output end of the thirteenth switch transistor is connected to the high electrical potential signal.

8. The scan driving circuit according to claim 5, wherein the pull-down maintaining module further comprises a twelfth switch transistor;

wherein a control end of the twelfth switch transistor is connected to the reference point P(N), an input end of the twelfth switch transistor is connected to the output end of the seventh switch transistor, and an output end of the twelfth switch transistor is connected to the reference point P(N).

9. A scan driving circuit, executing a driving operation for cascaded scan lines, comprising:

a pull-up control module receiving a previous-level scan signal and a previous-level down-stream signal, and generating a scan level signal corresponding to one of the scan lines according to the previous-level scan signal and the previous-level down-stream signal;

a pull-up module pulling up a present-level scan signal of the corresponding scan line according to the scan level signal and a present-level clock signal;

a pull-down module pulling down the scan level signal of the corresponding scan line according to a clock driving signal;

a down-stream module generating a present-level down-stream signal according to the scan level signal and a present-level clock signal;

a pull-down maintaining module keeping the scan level signal of the corresponding scan line in a low-level;

a bootstrap capacitor generating a high-level of the present-level scan signal of the scan line; and a constant low-level voltage source providing a pull-down low-level;

wherein the pull-up control module is connected to the pull-up module, the pull-down module, the down-stream module, the pull-down maintaining module and the bootstrap capacitor respectively, and the constant low-level voltage source is connected to the pull-down maintaining module and the pull-down module respectively;

wherein the pull-up control module comprises a first switch transistor, a control end of the first switch transistor inputs the previous-level down-stream signal, an input end of the first switch transistor inputs the previous-level scan signal, and an output end of the first switch transistor is connected to the pull-up module, the pull-down module, the down-stream module, the pull-down maintaining module and the bootstrap capacitor respectively;

wherein the pull-down maintaining module comprises a fifth switch transistor, a sixth switch transistor, a seventh switch transistor, an eighth switch transistor, a ninth switch transistor and a tenth switch transistor;

wherein a control end of the fifth switch transistor is connected to a high electrical potential signal, an input end of the fifth switch transistor is connected to the high electrical potential signal, and an output end of the fifth switch transistor is connected to a control end of the sixth switch transistor;

wherein an input end of the sixth switch transistor is connected to the high electrical potential signal, and an output end of the sixth switch transistor is connected to a reference point P(N);

wherein a control end of the seventh switch transistor is connected to the output end of the first switch transistor, an input end of the seventh switch transistor is connected to the reference point P(N), and an output end of the seventh switch transistor is connected to an input end of the eighth switch transistor;

wherein a control end of the eighth switch transistor is connected to the output end of the fifth switch transistor, and an output end of the eighth switch transistor is connected to the constant low-level voltage source;

wherein a control end of the ninth switch transistor is connected to the reference point P(N), an input end of the ninth switch transistor is connected to the output end of the first switch transistor, and an output end of the ninth switch transistor is connected to the constant low-level voltage source; and wherein a control end of the tenth switch transistor is connected to the reference point P(N), an input end of the tenth switch transistor is connected to the output end of the second switch transistor, and an output end of the tenth switch transistor is connected to the constant low-level voltage source.

10. The scan driving circuit according to claim 9, wherein the pull-up module comprises a second switch transistor, a control end of the second switch transistor is connected to the output end of the first switch transistor of the pull-up control module, an input end of the second switch transistor inputs the present-level clock signal, and an output end of the second switch transistor outputs a present-level scan signal.

11. The scan driving circuit according to claim 9, wherein the pull-down module comprises a third switch transistor, a control end of the third switch transistor inputs the clock driving signal, an input end of the third switch transistor is connected to the output end of the first switch transistor of the pull-up control module, and an output end of the third switch transistor is connected to the constant low-level voltage source.

12. The scan driving circuit according to claim 9, wherein the pull-down maintaining module further comprises an eleventh switch transistor;

wherein a control end of the eleventh switch transistor is connected to the output end of the first switch transistor, an input end of the eleventh switch transistor is connected to the output end of the fifth switch transistor, and an output end of the eleventh switch transistor is connected to the control end of the eighth switch transistor.

13. The scan driving circuit according to claim 12, wherein the constant low-level voltage source provides a first pull-down low-level, a second pull-down low-level and a third pull-down low-level, the output end of the eighth switch transistor is connected to the second pull-down low-level of the constant low-level voltage source, the output end of the ninth switch transistor and the output end of the third switch transistor of the pull-down module are connected to the third pull-down low-level of the constant low-level voltage source respectively, and the output end of the tenth switch transistor is connected to the first pull-down low-level of the constant low-level voltage source.

14. The scan driving circuit according to claim 13, wherein an absolute value the third pull-down low-level is greater than an absolute value the second pull-down low-level, and the absolute value the second pull-down low-level is greater than an absolute value the first pull-down low-level.

15. The scan driving circuit according to claim 13, wherein the pull-down maintaining module further comprises a twelfth switch transistor and a thirteenth switch transistor;
    wherein a control end of the twelfth switch transistor is connected to the reference point P(N), an input end of the twelfth switch transistor is connected to the output end of the seventh switch transistor, and an output end of the twelfth switch transistor is connected to the high electrical potential signal;
    wherein a control end of the thirteenth switch transistor is connected to the high electrical potential signal, an input end of the thirteenth switch transistor is connected to the reference point P(N), and an output end of the thirteenth switch transistor is connected to the high electrical potential signal.

16. The scan driving circuit according to claim 13, wherein the pull-down maintaining module further comprises a twelfth switch transistor;
    wherein a control end of the twelfth switch transistor is connected to the reference point P(N), an input end of the twelfth switch transistor is connected to the output end of the seventh switch transistor, and an output end of the twelfth switch transistor is connected to the reference point P(N).

17. The scan driving circuit according to claim 9, wherein the scan driving circuit further comprises:
    a reset module executing a reset operation for the scan level signal of the present-level scan line.

* * * * *